US006384756B1

(12) United States Patent
Tajiri et al.

(10) Patent No.: US 6,384,756 B1
(45) Date of Patent: May 7, 2002

(54) HIGH-SPEED WAVEFORM DIGITIZER WITH A PHASE CORRECTING MEANS AND A METHOD THEREFOR

(75) Inventors: Shinsuke Tajiri; Koji Asami, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/505,955

(22) Filed: Feb. 17, 2000

(30) Foreign Application Priority Data

Feb. 17, 1999 (JP) .......................................... 11-038673
Mar. 19, 1999 (JP) .......................................... 11-075494

(51) Int. Cl.$^7$ ............................................... H03M 1/10
(52) U.S. Cl. ........................................ 341/120; 341/118
(58) Field of Search ................................. 341/118, 120; 708/603

(56) References Cited

U.S. PATENT DOCUMENTS

| 3,871,577 A | * | 3/1975 | Avellar et al. ............... 708/404 |
| 4,181,968 A | * | 1/1980 | Johnson ........................ 708/603 |
| 4,763,105 A | * | 8/1988 | Jenq ............................ 341/120 |
| 5,239,299 A | * | 8/1993 | Apple et al. ................. 341/118 |

FOREIGN PATENT DOCUMENTS

| DE | 38 85 166 T2 | 1/1989 |
| EP | 0 298 618 B1 | 1/1989 |
| GB | 2187054 | 8/1987 |

OTHER PUBLICATIONS

Hummels et al., Distortion Compensation for Time–Interleaved Analog–to–Digital Converters, IEEE Conference Proceedings from the Instrumentation and Measurement Technology Conference, 1996, IMTC–96, 4–6 bJune. 1996, pp. 728–731.*
Yamaguchi et al., Dynamic Testing of ADCs Using Wavelet Transforms, IEEE 1997 International Test Conferenec, Proceedings of; Nov. 1997, pp. 379–388.*
Khoini–Poorfard et al., Time–Interleaved Oversampling A/D Converters: Theory and Practice, IEEE Transactions on Circuits and Systems–II: Analog and Digital Processing, vol. 44, No. 8, Aug. 1997, pp. 634–645.*
Jenq, Digtal Spectra of Non–Uniformly Sampled Signals: Theories and Applications Part I, Conference Record Fifth IEEE Instrumentation and Measurement Technology Conference, 1998. Apr. 1988, pp. 391–398.*
Patent Abstracts of Japan, Publication No. 01080131 A; Mar. 27, 1989; 1 page.
Asami, et al., "A Method to Improve the Performance of High–speed Waveform Digitizing" IEEE International Test Conference, Paper 35.3, Sep. 28–30, 1999, pp. 947–954.

* cited by examiner

*Primary Examiner*—Howard L. Williams
(74) *Attorney, Agent, or Firm*—Rosenthal & Osha L.L.P.

(57) ABSTRACT

A digitizer for converting an analog signal output from a semiconductor device to a digital signal, includes: N Analog-to-Digital converters (ADC's) (31, 32), which sequentially convert the analog signal output from the semiconductor device to the digital signal, a phase error term being denoted τ; an N-way time interleaving unit (40) which interleaves the digital signals from said ADC's in sequence and produces data sequence; and a Fourier Transformation (FT) processing unit (50) for performing FT processing on the data sequence output from said N-way time interleaving unit, the FT processing unit including a butterfly operation unit (220) which inserts a phase error correcting factor to a butterfly operation performed by said butterfly operation unit, so as to correct τ.

26 Claims, 5 Drawing Sheets

HIGH-SPEED WAVEFORM DIGITIZER WITH A PHASE CORRECTING MEANS AND A METHOD THEREFOR

This patent application claims priority based on Japanese patent applications, H11-075494 filed on Mar. 19, 1999 and H11-038673 filed on Feb. 17, 1999, the contents of which are incorporated herein by reference.

BACKGROUND OF THE INVENTION

1. Field of the Invention

The present invention relates to a waveform digitizer using time-interleaved Analog-to-Digital Converters (ADC's) and it particularly relates to a correcting means which detects and corrects a measurement error accompanied by a phase error of a sampling timing at the time of the time-interleaved AD conversion.

2. Description of the Related Art

In an N-way time-interleaved waveform digitizer using Analog-to-Digital converters (also referred to as ADC's hereinafter), implementation of a plurality (N) of ADC's makes possible for an apparent sampling rate to increase. Then, timing of the sampling is required to be precise.

For example, let us consider a 2-way time-interleaved digitizer. Suppose that the number of time series data are 2 to the power of 12, that is 4,096.

First of all, an internal structure for the conventional FFT (Fast Fourier transformation) processing unit will be described. Suppose that there are eight input sampling data, x(0) ... x(7), where 8 is 2 to the power of 3 ($8=2^3$)

Upon receipt of each of 2-way time-interleaved data (4,096 time series data sequences) from an interleaving operation unit 40, the FFT processing unit performs the fast Fourier transformation on the 4,096 time series data, and outputs 4,096 FFT-processed frequency spectrum data. In this case, the internal structure of the FFT processing unit includes the first FFT processing unit, the second FFT processing unit and a butterfly operation unit. The butterfly operation unit plays a role of performing the last steps of the FFT operation. In this instance, the first and second FFT processing units receive respectively 2,048 time series data and perform FFT process on them, and then output the FFT-processed 2,048 time series data (complex-valued data) respectively.

The butterfly operation unit connected to the first and second FFT processing units, outputs 4,096 frequency spectrum data obtained by the butterfly operation (X(0) ... X(7)).

Here, for the sake of simplicity, suppose that both the first ADC and second ADC have the same identical characteristics such that the timing characteristics at the time of sampling include a group delay characteristic and aperture delay characteristic and so forth.

The analog signals to be measured output from the DUT are supplied to input terminals of both the first ADC and second ADC so that the first ADC takes care of the sampling of even-numbered data sequences, and the even-numbered time series data to be output are labeled D0, D2, D4, ... The second ADC takes care of the sample of odd-numbered data sequences, and the odd-numbered time series data to be output are labeled D1, D3, D5, ... Then, upon receipt of both the above data sequences, the interleaving operation unit output the time series data D0, D1, D2, D3, D4, D5, ... which are alternately interleaved.

In the conventional practice, it was presupposed that sampling timing between a plurality of ADC's does not fluctuate and that the sampling clock rate is kept constant or the sampling clock rate is constant within an allowable error range. On the other hand, in reality, the sampling characteristics of the ADC's are affected by irregularity of parts for ADC elements, ambient temperature, deterioration with age and fluctuation of the power voltage and so forth, thereby the sampling intervals which shall be the same fluctuate. Moreover, when utilized in semiconductor testing apparatus which tests and measures the DUT's with a clock frequency fclk to be sampling-performed being variable in the wide range, the group delay characteristics is changed as the clock frequency fclk changes. Accompanied by all these above factors, there occurs a deviation from an ideal sampling timing. This drawback causes a difficulty in the course of obtaining further accurate frequency spectrum of the input signals.

SUMMARY OF THE INVENTION

Therefore, it is an object of the present invention to provide a high-speed waveform digitizer using time-interleaved A–D converters which measures the sampling phase errors and capable of correcting such phase errors in a butterfly operation unit included in an FFT processing unit and a method therefor. This object is achieved by combinations described in the independent claims. The dependent claims define further advantageous and exemplary combinations of the present invention.

According to one aspect of the present invention, there is provided a digitizer for converting an analog signal output from a semiconductor device to a digital signal, comprising: N Analog-to-Digital converters (ADC's) which sequentially convert the analog signal output from the semiconductor device to the digital signal, a phase error term of sampling time displaced from an ideal timing being denoted $\tau$; an N-way time interleaving unit which interleaves the digital signals output from said ADC's in sequence and produces data sequence; and a Fourier Trans formation (FT) processing unit for performing FT processing on the data sequence output from said N-way time interleaving unit, the FT processing unit including a butterfly operation unit which inserts a phase error correcting factor to a butterfly operation performed by said butterfly operation unit, so as to correct $\tau$.

In the digitizer, said FT processing unit may perform a Fast Fourier Transformation (FFT) processing on the data sequence or may perform a Discrete Fourier Transformation (DFT) processing on the data sequence.

Moreover, the digitizer may be configured such that an FFT processing unit includes a first FFT processing unit for performing an FFT process in g on an even-numbered data sequence and a second FFT processing unit for performing an FFT processing on an odd-numbered data sequence, and that said butterfly operation unit multiplies the first phase correcting factor of the phase correcting factor to the data sequence which is FFT-processed by said second FFT processing unit.

Moreover, preferably said butterfly operation unit in the digitizer may further multiply the second and third phase error correcting factors of the phase error correcting factors to the data sequence which are FFT-processed by said first and second FFT processing units.

In carrying out the present invention in one preferred mode, the digitizer may be configured that the first phase error correcting factor being denoted $\alpha$ is represented by $$\alpha = \exp[j\pi\tau/Ts]$$

where Ts is a sampling period of the analog signal and j is a imaginary number unit such that $j^2=-1$.

Moreover, the second and third phase error correcting factors being denoted $\beta$ and $\beta'$, respectively, may be such that $\beta+\beta'=1$.

Preferably, the digitizer having two ADC's and $m=2^n$ input data is configured such that the butterfly operation unit corrects the phase error $\tau$ based on:

$$X(k)=\beta\{X_{even}(k)+\alpha \cdot \overline{W}_m{}^k X_{odd}(k)\}$$

$$X(p)=\beta'\{X_{even}(k)+\alpha \cdot \overline{W}_m{}^p X_{odd}(k)\}$$

where k runs through 0 and $2^{n-1}-1$, and p runs through $2^{n-1}$ and $2^n-1$, $\beta=1/(1+\alpha)$,
$\beta'=\alpha/(1+\alpha)$,
$\overline{W}_m=W_m{}^{(1+\tau/Ts)}$ $X_{even}(k)$ is an FFT value of an even-numbered data sequence x(even) output from said time interleaving unit, $X_{odd}(k)$ is an FFT value of an odd-numbered data sequence x(odd) output from said time interleaving unit, and X(k) and X(p) are final values output from the butterfly operation unit.

According to another aspect of the present invention, a digitizer having $2^3(=8)$ input data and three layered (step) butterfly operation units which correct the phase errors may be provided such that, upon receipt of 8 input data, one ($\tau 0$) of the total of 8 phase errors ($\tau 0$, $\tau 1$, $\tau 2$, $\tau 3$, $\tau 4$, $\tau 5$, $\tau 6$, $\tau 7$) is made as a reference timing and the phase error correcting butterfly operation units correct the phase errors $\tau$'s in a manner that: in the four first-step error correcting butterfly operation units the phase error correcting butterfly operations are performed on ($\tau 4-\tau 0$), ($\tau 6-\tau 2$), ($\tau 5-\tau 1$) and ($\tau 7-\tau 3$), in the two second-step phase error correcting butterfly operation units the phase error correcting butterfly operations are performed on ($\tau 2-\tau 0$) and ($\tau 3-\tau 1$) and in the one third(last)-step phase error correcting butterfly operation units the phase error correcting butterfly operation is performed on ($\tau 1-\tau 0$).

When there are 4-way time interleaving units for $2^2(=4)$ input data, preferably the digitizer having two layered (step) butterfly operation units which correct the phase errors may be provided such that, upon receipt of 4 input data, one ($\tau 0$) of the total of 4 phase errors ($\tau 0$, $\tau 1$, $\tau 2$, $\tau 3$) is made as a reference timing and the phase error correcting butterfly operation units corrects the phase errors $\tau$'s in a manner that: in the two first-step error correcting butterfly operation units the phase error correcting butterfly operations are performed on ($\tau 2-\tau 0$) and ($\tau 3-\tau 1$) and in a single second(last) -step error correcting butterfly operation unit the phase error correcting butterfly operation is performed on ($\tau 1-\tau 0$).

According to still another aspect of the present invention, there is provided a method of correcting the phase error of the sampling period of the analog signal output from the semiconductor device, comprising: sequentially converting the analog signal output from the semiconductor device to the digital signal; time-interleaving the digital signals obtained from said converting the analog signal to the digital signal, so as to produce data sequence; and performing Fast Fourier Transformation processing on the data sequence obtained from said time-interleaving, said FFT processing including: inserting at least one phase error correcting factor to a butterfly operation, so as to correct $\tau$.

This summary of the invention does not necessarily describe all necessarily features so that the invention may also be sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
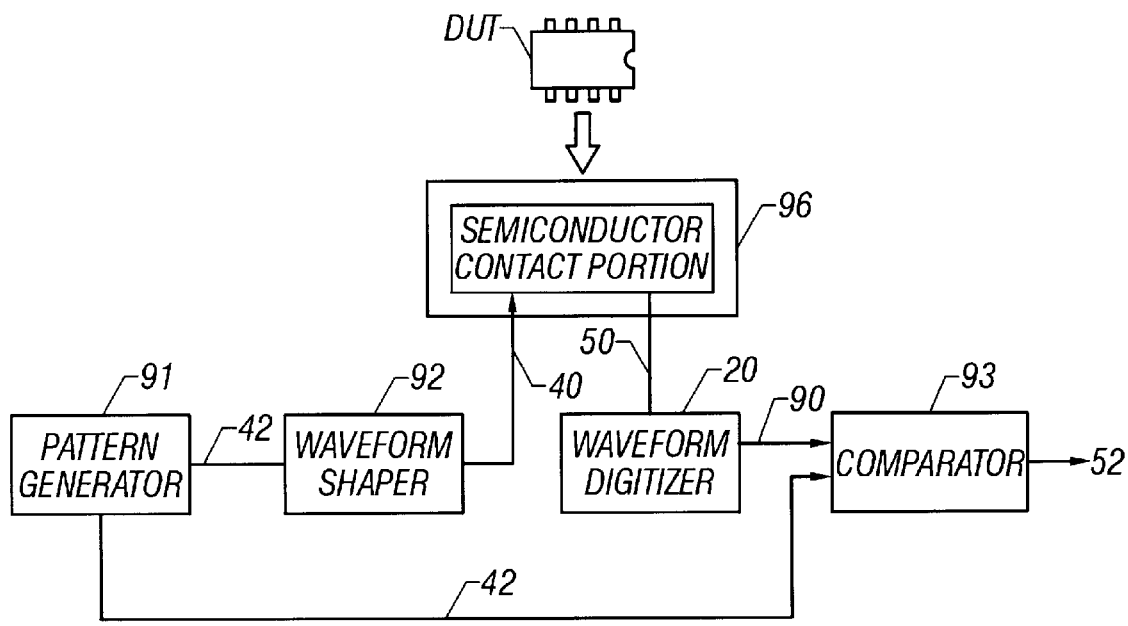
FIG. 1 is a block diagram showing a typical semiconductor testing apparatus including a waveform digitizer.

FIG. 1 is a block diagram showing a semiconductor testing apparatus which tests the semiconductor device that outputs analog signals. The semiconductor testing apparatus comprises a waveform digitizer 20 including at least one A–D converter, a pattern generator 91, a waveform shaper 92, a comparator 93 and a performance board 96 having a semiconductor device contact portion therein. A semiconductor device to be tested (DUT) which outputs the analog signals is placed in the semiconductor device contact portion. The pattern generator 91 generates a semiconductor device input signal 42. The semiconductor device input signal 42 is input to the waveform shaper 92 so that the waveform is shaped according to the characteristic of the DUT. The waveform shaped input signal 40 of the semiconductor device DUT is supplied to the semiconductor device contact portion. The semiconductor device contact portion supplies the semiconductor device input signal 40 to the DUT. The DUT outputs an analog signal 50 based on the semiconductor device input signal 40. The analog signal 43 is input to the A–D converter of the waveform digitizer 20 so as to be converted to a digital signal. A comparator 93 determines the quality of the DUT based on an output signal in which the phase error is corrected and the semiconductor input signal which is supplied from the pattern generator 91.

Since the inner structure of a Fast Fourier Transformation (FFT) processing unit which is included in the waveform digitizer 20 is widely known conventionally, detailed description therefor is omitted except for major parts thereof.

Figure 2:
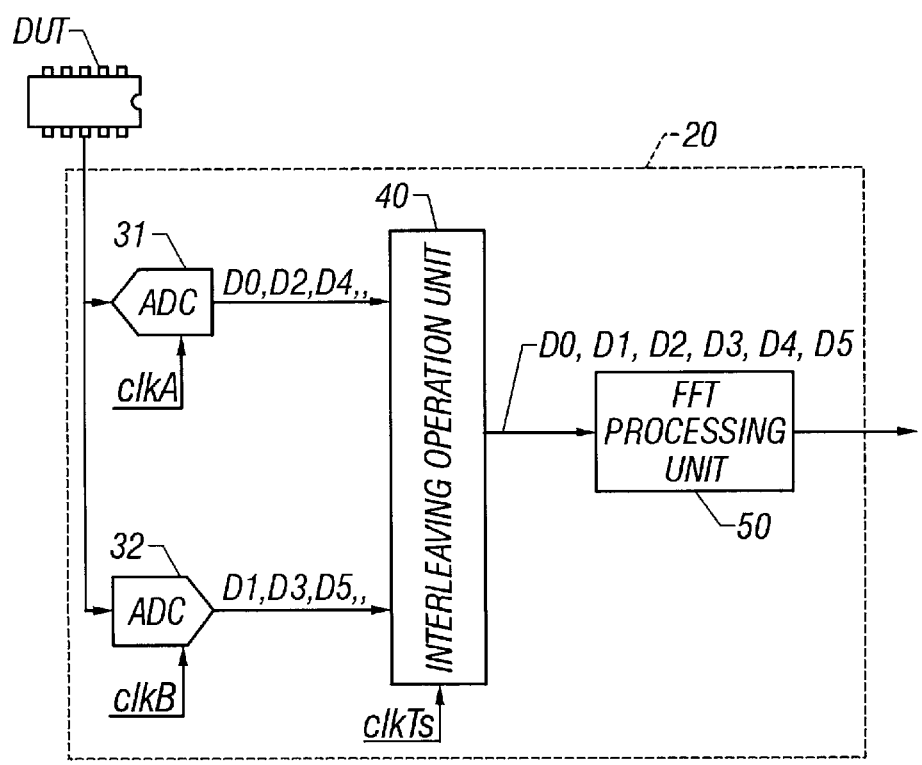
FIG. 2 is a block diagram showing a typical structure of the waveform digitizer having 2-way time interleaving Analog-to-Digital Converters (ADC's).

FIG. 2 shows one method for achieving faster waveform digitizing uses time-interleaved Analog-to-Digital Converters (ADC's) 31, 32. Time interleaving with two or more ADC's enables waveform digitizing at sampling rates faster than when using merely a single ADC.

A waveform digitizer 20 for use in a semiconductor testing apparatus, is usually comprised of: the first ADC 31 to which analog signals from a device under test (DUT) is sent; the second ADC 32; a time interleaving operation unit which receives digital signals from the first and second ADC's 31, 32 and to which a sampling period of the analog signals denoted by Ts is also supplied; and a Fast Fourier Transformation (FFT) processing unit which FFT processes data sequence output from the time interleaving operation unit 40. Moreover, under usual circumstances, sampling data which both the ADC's 31, 32 acquired are temporarily stored in buffer memories and thereafter are supplied to the FFT processing unit so as to be processed there.

Figure 3:
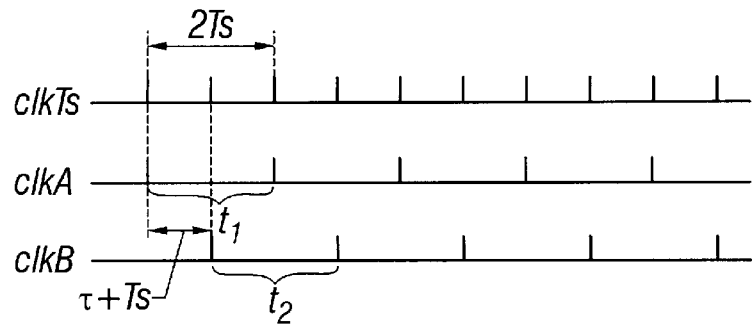
FIG. 3 illustrates a sampling clock made of two sampling sequences respectively output from two ADC's shown in FIG. 2.

Referring to FIG. 2 and FIG. 3 where two ADC's 31, 32 are used, the sampling rate increases by a factor of two compared to the sampling rate where only single ADC is used. Referring to FIG. 3, let τ denote a phase error of sampling pulse sequences and Ts the sampling period, and then τ+Ts the timing at which the sampling clock clkB is applied. The phase error τ is also called a time alignment error term. As will be described hereinbelow, embodiments according to the present invention realizes to remove the time alignment error of sampling sequences by implementing a correcting means at a last stage performed at an FFT processing unit 50.

The sampling clocks clkA and clkB are fed to the first ADC 31 and second ADC 32, respectively.

FIG. 3 illustrates a sampling clock made of two sampling sequences respectively output from two ADC's 31, 32 shown in FIG. 2.

Phase intervals t1 and t2 between the sampling clocks clkA and clkB must be adjusted such that both t1 and t2 are of the same interval to each other. If sampling-performed code data containing the phase error therein are received and FFT-processed as such, it is known that its output result will not present correct frequency spectrum.

Figure 4:
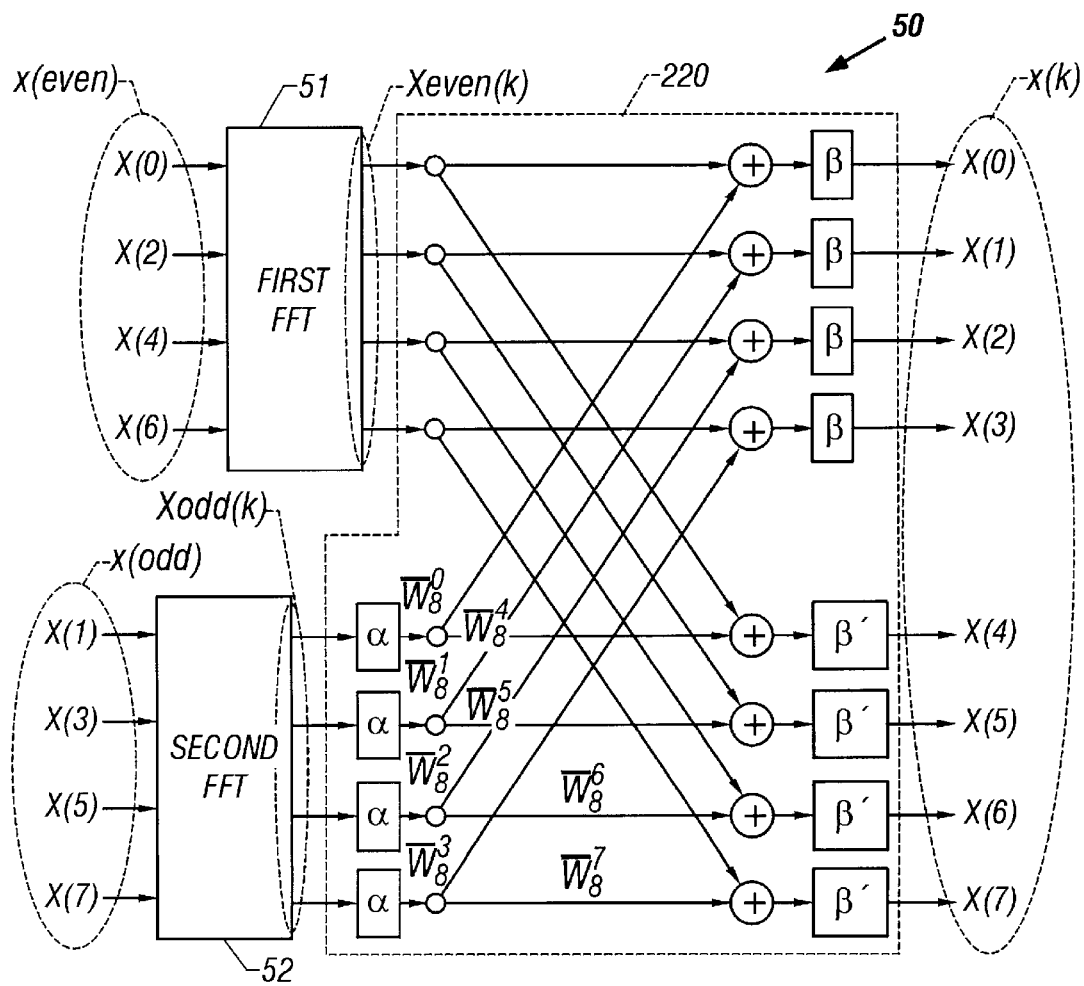
FIG. 4 illustrates an FFT processing scheme including a butterfly operation unit therein for correcting the phase error according to an embodiment of the present invention.

FIG. 4 shows a phase correcting butterfly operation unit 220 in the FFT processing unit 50 according to the first embodiment of the present invention. The FFT processing unit 50 comprises: the first FFT processing unit 50 which receives the even-numbered data sequence output from the time interleaving unit 40 and performs the Fast Fourier Transformation on the even-numbered data sequence; the second FFT processing unit 52 which receives the odd-numbered data sequence output from the time interleaving unit 40 and performs the Fast Fourier Transformation thereon; and the butterfly operation unit 220 which inserts at least one phase error correcting factor to the data sequence which is output from the time interleaving unit and thereafter is FFT-processed by the first FFT processing unit 51 and/or the second FFT processing unit 52. Suppose that the number of data to be input to the FFT processing unit 50 is 8, a procedure to calculate the frequency spectrum data X(k) from time-interleaving waveform data x(k) where k runs from 0 to 7 (k=0, 1, . . . , 7) is as follows.

For example, among the time-interleaving waveform data x(k), the even-numbered data are input to the first FFT processing unit 51 while the odd-numbered data are input to the second FFT processing unit 52. Those input data are FFT-processed by respective FFT processing units, so that data output from the first FFT processing unit are labeled as X$_{even}$(k) (hereinbelow written also as X_even (k)) whereas data output from the second FFT processing unit are labeled as X$_{odd}$(k) (hereinbelow written also as X_odd (k)). Upon receipt of the above data from the first and second FFT processing units, frequency spectrum data X(k) are output from a butterfly operation unit 220 provided in the last stage of FFT processing by implementing the following equations $$X(0)=X\_even\ (0)+W\_8^{\char`\^}0\ X\_odd\ (0)$$

(where W_8^0 indicates W with subscript being 8 and superscript being 0)

$$X(0)=X\_even\ (0)+W\_8^{\char`\^}0\ X\_odd\ (0)$$
$$X(1)=X\_even\ (1)+W\_8^{\char`\^}1\ X\_odd\ (1)$$
$$X(2)=X\_even\ (2)+W\_8^{\char`\^}2\ X\_odd\ (2)$$
$$X(3)=X\_even\ (3)+W\_8^{\char`\^}3\ X\_odd\ (3)$$
$$X(4)=X\_even\ (0)+W\_8^{\char`\^}4\ X\_odd\ (0)$$
$$X(5)=X\_even\ (1)+W\_8^{\char`\^}5\ X\_odd\ (1)$$
$$X(6)=X\_even\ (2)+W\_8^{\char`\^}6\ X\_odd\ (2)$$
$$X(7)=X\_even\ (3)+W\_8^{\char`\^}0\ X\_odd\ (3)$$

In the above equations, let $W_8=\exp[-j2\pi/8]=\cos[2\pi/8]-j\cdot\sin[2\pi k/8]=1/\sqrt{2}-j(1/\sqrt{2})$ ($0\leq k\leq 7$), where j denotes the imaginary number unit such that $j^2=-1$.

Suppose that τ denotes a phase error of sampling pulse sequences, Ts the sampling period and suppose that the even-numbered input signals and the odd-numbered input signals among the total of eight input signals show different sampling period. Now, in order to correct a phase error τ, there is provided the phase correcting butterfly operation unit 220 as shown in FIG. 4. The butterfly operation unit 220 performs the butterfly operation at a last stage of the FFT processing. The following equation (1) shows a novel butterfly operation achieved by the novel phase correcting butterfly operation unit 220. It is to be noted that τ can be called either the time alignment error or the phase error interchangeably in this specification.

$$X(0)=\beta\{X_{even}(0)+\alpha\cdot\overline{W}_8^0 X_{odd}(0)\}$$
$$X(1)=\beta\{X_{even}(1)+\alpha\cdot\overline{W}_8^1 X_{odd}(1)\}$$
$$X(2)=\beta\{X_{even}(2)+\alpha\cdot\overline{W}_8^2 X_{odd}(2)\}$$
$$X(3)=\beta\{X_{even}(3)+\alpha\cdot\overline{W}_8^3 X_{odd}(3)\}$$
$$X(4)=\beta'\{X_{even}(0)+\alpha\cdot\overline{W}_8^4 X_{odd}(0)\}$$
$$X(5)=\beta'\{X_{even}(1)+\alpha\cdot\overline{W}_8^5 X_{odd}(1)\}$$
$$X(6)=\beta'\{X_{even}(2)+\alpha\cdot\overline{W}_8^6 X_{odd}(2)\}$$
$$X(7)=\beta'\{X_{even}(3)+\alpha\cdot\overline{W}_8^7 X_{odd}(3)\}$$

In the above Equations (1), variables α, β and β' are complex numbers and defined as follows using the phase error τ and the sampling period Ts.

| | |
|---|---|
| $\alpha=\exp[j\pi\tau/Ts]=\cos[\pi\tau/Ts]+j\sin[\pi\tau/Ts]$ | Equation (A) |
| $\beta=1/(1+\alpha)$ | Equation (B) |
| $\beta'=\alpha(1+\alpha)$ | Equation (C) |
| $\char`\^W\_8=W\_8^{\char`\^}(1+\tau/Ts)$ | Equation (D) |

Symbol ^ in front of W is a substitution of upper bar over W_8 (see Equations (1) above) and _8 indicates a subscript 8 to W while ^ (1+τ/Ts) indicates a superscript to the W_8 and the power of (1+τ/Ts).

When n indicates the number of input data in place of 8, the equation (D) is expressed in general form of:

| | |
|---|---|
| $\char`\^W\_n=W\_n^{\char`\^}(1+\tau/Ts)$ | Equation (E) |

Combining equation (B) and equation (C), it can be deduced that:

$\beta+\beta'=1$ or $\beta'=\beta-1$, so it may be put that $\beta$ and $\beta'$ divide the line segment of 1.

Moreover, once a first phase error correcting factor such as $\alpha$ is defined, a second phase error correcting factor such as $\beta$ and third phase correcting factor such as $\beta'$ may be set such that $\beta+\beta'=1$ independently of the fist phase correcting factor.

Using the even-numbered input data as a reference, the sampling time of odd-numbered input data is displaced as a whole. This means that the sampling pulse sequence has phase error. Thus, in the present embodiment, $\alpha$ is multiplied so that the phase is rotated by $\pi\tau/Ts$. On the other hand, since the $\alpha$ shifts slightly the phase of whole data during the butterfly operation, it is necessary to offset this unwanted phase shift amount. Thus, $\beta$ is multiplied. $\beta'$ is similarly multiplied to the output data where the butterfly operation including the complex conjugates is performed in the vicinity of a Nyquist frequency.

Thereby, by implementing the butterfly operation unit 220 which corrects the phase error, the frequency spectrum data X(k) is obtained where the affect of the phase error $\tau$ is eliminated.

Though the above embodiment shows a case where there are 8 input data, the same principle for correcting the phase error $\tau$ is applied to the case with 8 replaced with any number of input data $2^n$, n being arbitrary integers greater than 1.

Namely, for example, for a digitizer having two ADC's and $m=2^n$ input data, n being greater than 1, the butterfly operation unit corrects the phase error $\tau$ based on:

$$X(k)=\beta\{X_{even}(k)+\alpha\cdot\overline{W}_m^k X_{odd}(k)\}$$

$$X(p)=\beta'\{X_{even}(k)+\alpha\cdot\overline{W}_m^p X_{odd}(k)\}$$

where k runs through 0 and $2^{n-1}-1$, and p runs through $2^{n-1}$ and $2^n-1$, $\beta=1/(1+\alpha)$, $\beta'=\alpha/(1+\alpha)$, $\overline{W}_m = W_m^{(1+\tau/Ts)}$ $X_{even}$ (k) is an FFT value of an even-numbered data sequence x(even), shown in FIG. 4, output from said time interleaving unit, $X_{odd}$(p) is an FFT value of an odd-numbered data sequence x(odd), shown in FIG. 4, output from said time interleaving unit, and X(k) and X(p) are final values output from the butterfly operation unit.

Specific calculation is carried out below using the above equations (1) and equations defined by (A)–(D). For example, let the sampling clocks clkA, clkB be 50 MHz. Since sampling is carried out at 100 MHz which is the double of the given 50 MHz due to two ADC's employed in this case by the time interleaving operation, Ts=1/1000MHz=10ns.

Now, suppose that the phase error $\tau$=2.5 ns, then $\tau/Ts=0.25$, and variables $\alpha$, $\beta$, $\beta'$ which are complex values become as follows:

$\alpha=\exp[j\ \pi\tau/Ts]=\cos[\pi\tau/Ts]+j\sin[\pi\tau/Ts]=0.707+j\ 0.707$ $\beta=1/(1+\alpha)=1/(1.707+j\ 0.707)=0.5-j\ 0.207107$ $\beta'=\alpha/(1+\alpha)=1-\beta=0.5+j\ 0.207107$ $\hat{W}\_8=W\_8^{(1+\tau/Ts)}=(0.707-j\ 0.707)^{1.25}=0.555-j\ 0.831$ Note also that $\hat{W}\_8$ is a complex value and is called a twiddle factor or rotation factor.

Here, $\tau$ is obtained in the following manner. The identical sinusoidal waveforms are input to the two ADC's and A–D converted and FFT processed, then $\tau$ is found in the phase difference thus obtained. In other words, $\tau$ can be easily obtained from the frequency spectrum results thus obtained. It is to be noted that instead of having measured $\tau$ in advance, the measurement of $\tau$ once is enough if a sinusoidal waveform is inserted in the band beyond the signals to be measured.

Thereby, by implementing the modified operation involving the above $\alpha$ (the first correcting coefficient), $\beta$ (the second correcting coefficient) and $\beta'$ (the third correcting coefficient) such that the butterfly operation unit 220 multiplies the first phase correction factor to the data sequence which is FFT-processed by the second FFT processing unit while the butterfly operation unit 220 further multiplies the second and third phase error correcting factors to the data sequence which are FFT-processed by the first and second FFT processing units 51, 52, there is obtained an FFT-processed output result where the errors caused by the time alignment error $\tau$ is offset even though $\tau$ is present at the time of the applied timing of the sampling clock clkB.

Moreover, though the error correcting is described above in the case of 2-way time interleaving operation, the above correcting means may be applied to any N-way interleaving structures (N being greater than 2).

FIG. 2 is a block diagram showing a typical structure of the waveform digitizer 20 having 2-way time interleaving operation. Referring to FIG. 2, the structure of the 2-way interleaving digitizer 20 is such that the digitizer 20 comprises the first Analog-to-Digital Converter (ADC) 31 to which a signal from a device to be tested (DUT) is fed and a clock clkA is fed, the second ADC 32 to which a signal from the DUT is fed and a clock clkB is fed and a time interleaving processing unit 40 which receives signals from the first and second ADC's to perform the time interleaving operation thereon and outputs such time-interleaved signals to an FFT processing unit 50. The first ADC 31 outputs the even-numbered time series data D0, D2, D4, . . . , which were sampled by the sampling clock clkA of a sampling clock 2Ts. The second ADC 32 outputs the odd-numbered time series data D1, D3, D5, . . . , which were sampled by the sampling clock clkB of the sampling clock 2Ts. Upon receipt of both the even- and odd-numbered data, the time interleaving processing unit 40 outputs alternately interleaved time series data D0, D1, D2, D3, D4, D5, . . . In other words, the signals that the DUT outputs are sampled by the sampling period of 2Ts/2=Ts.

Here, if the applied timing of the sampling clock clkB is $\tau$+Ts, a problems arises that it is difficult to give rising/falling (or vice versa) edges for both sampling clocks clkA and clkB so that $\tau$=0. Thus, according to the present invention, the error associated with the sampling timing is removed by providing a modified phase correcting means disclosed in this specification.

Next, theoretical principles for the present emboidment will be described in detail.

Hereinbelow in this specification, the left-hand side symbol (x bar of t) in the following equation Eq. (101) may be expressed interchangeably as $\hat{x}(t)$.

$$\bar{x}(t) = x(t) \cdot p(t) \qquad \text{Eq. 101}$$
$$= x(t) \cdot \sum_{n=-\infty}^{\infty} \delta(t-nT_s)$$

$$= \sum_{n=-\infty}^{\infty} x(nT_s)\delta(t - nT_s)$$

In the above Eq. (101), ^x(t) that is x(t)•p(t) is a sampled signal waveform. In Eq. (101), Ts denotes the sampling period while δ (t) denotes the delta function, and p(t) a sampling pulse sequence and x(t) a signal waveform to be measured, that is an input signal to an ADC. Note that the output of the ADC's (in this case it is supposed that there are two ADC's) can be treated as a continuous-valued function.

Figure 5A:
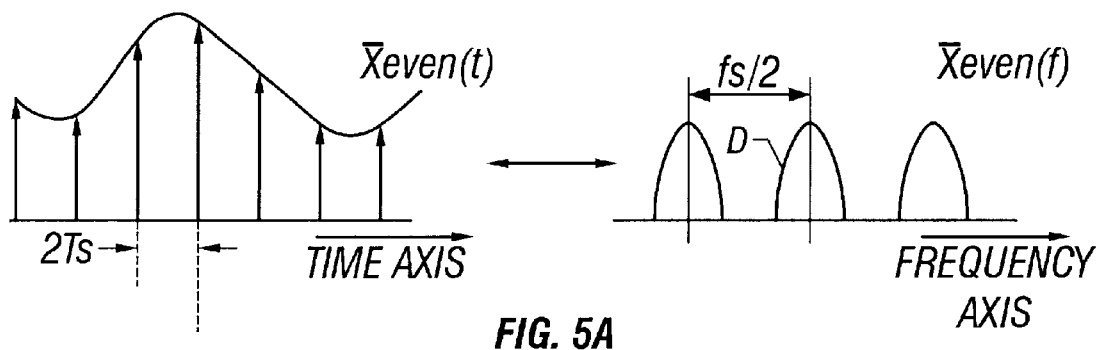
FIGS. 5A, 5B and 5C show sampled waveforms in the time domain and frequency domain.
Figure 5B:
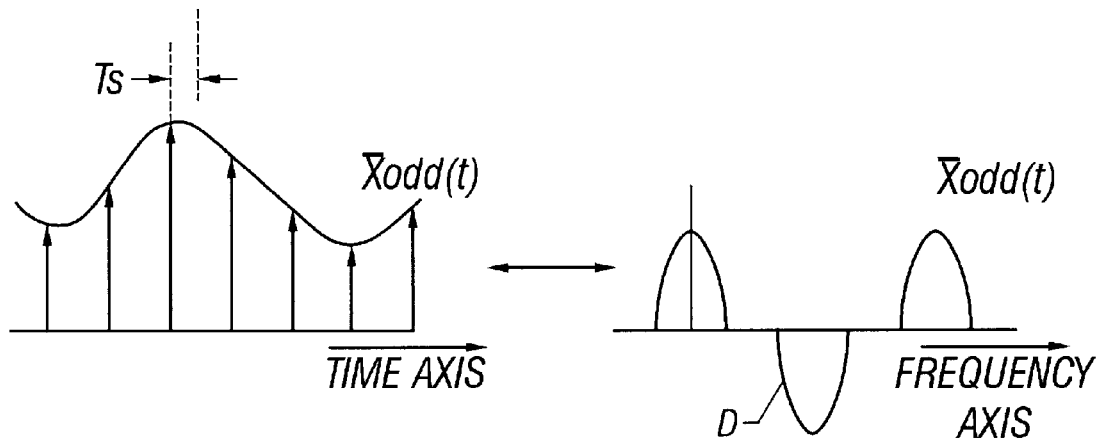
Figure 5C:
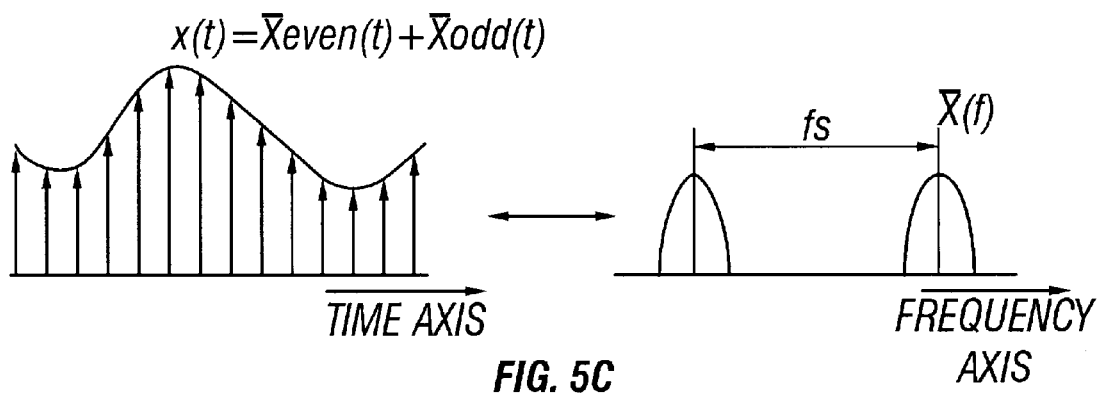

FIGS. 5A, 5B and 5C show sampled waveforms in the time domain and frequency domain. Since the digitizer 20 is of 2-way time-interleaved structure in the case where there are provided the first ADC 31 and second ADC 32 as shown in FIG. 2, the sampling period 2Ts is alternately sampled as shown in FIG. 5A and FIG. 5B. FIG. 5A shows a sampled waveform of the even-numbered data and the right-hand waveform is the Fourier transformation processed waveform (in the frequency domain) of the left-hand side waveform in the time domain. Similarly, FIG. 5B shows a sampled waveform of the odd-numbered data. The p(t) is the sampling pulse sequence defined as a sequence of the delta function. Denoting the two sampling pulse sequences accompanied by each ADC as $P_{even}(t)$ and $P_{odd}(t)$, their representation take the forms of:

$$P_{even}(t) = \sum_{m=-\infty}^{\infty} \delta(t - 2mT_s) \qquad \text{Eq. 102-1}$$

$$P_{odd}(t) = \sum_{m=-\infty}^{\infty} \delta(t - (2m+1)T_s - \tau) \qquad \text{Eq. 102-2}$$

Now, suppose that the phase error between the sampling clocks of the two ADC's is time-delayed by τ as shown in FIG. 3. The sampled waveforms at the side of the even-numbered data and odd-numbered data are expressed in the same manner by Eq. 103-1 and Eq. 103-2, respectively. It is to be noted here that the finite number of data is dealt with by the Eq. 103-1 and Eq. 103-2:

$$\overline{x}_{even}(t) = \sum_{m=0}^{N/2-1} x(2mT_s)\delta(t - 2mT_s) \qquad \text{Eq. 103-1}$$

$$\overline{x}_{odd}(t) = \sum_{m=0}^{N/2-1} x((2m+1)T_s + \tau)\delta(t - (2m+1)T_s - \tau) \qquad \text{Eq. 103-2}$$

The τ found in the Eq. (102-2) is the phase error of the sampling pulse sequences, and in the case where τ=0, the relation p(t) =$P_{even}$(t)+$P_{odd}$(t) holds. It is to be noted that the sampling period is 2Ts and that the number of data is N/2.

First, the case of τ=0 is examined. The relation between ^X_even(t), ^X_odd(t) and ^X(t) in the time domain is considered in the frequency domain. As multiplication of waveforms in the time domain is converted to convolution in the frequency domain, the Fourier transformation of Eq. (101) is given by the following Eq. 104.

$$\overline{X}(f) = X(f) * P(f) \qquad \text{Eq. 104}$$

$$= X(f) * \frac{1}{T_s} \sum_{k=-\infty}^{\infty} \delta\left(f - \frac{k}{T_s}\right) = \frac{1}{T_s} \sum_{k=-\infty}^{\infty} X\left(f - \frac{k}{T_s}\right)$$

In the above Eq. 104, the asterisk stands for convolution, and the convention to use capitalized symbols for denoting Fourier transformed waveforms is followed here. In the same manner, the Fourier transforms of the sampled waveforms at the side of the even-numbered data ^x_even(t) and odd-numbered data ^x_odd(t) are given by the following equations (105-1) and (105-2), respectively:

$$\overline{X}_{even}(f) = \frac{1}{2T_s} \sum_{k=-\infty}^{\infty} X\left(f - \frac{k}{2T_s}\right) \qquad \text{Eq. 105-1}$$

$$\overline{X}_{odd}(f) = \frac{1}{2T_s} \sum_{k=-\infty}^{\infty} X\left(f - \frac{k}{2T_s}\right) \cdot e^{-j\pi k} \qquad \text{Eq. 105-2}$$

FIGS. 5A–5C show the sampled waveforms in the left side while their respective Fourier transformed waveforms are shown in the corresponding right side. As seen from these plots, odd terms where k is odd in summation of Eq (105-2) corresponding to the Fourier transformed waveform shown in FIG. 5B are inverted to the ones in that of Eq (105-1) corresponding to FIG. 5A. Thus these terms are canceled out from the expression of ^X_even(f)+^X_odd(f) as is seen from FIG. 5C.

Next, the other case where τ is not 0 is examined in what follows. The expression ^X such that ^X=^X_even(f) +^X_odd(f) is given by the Equation (106) below.

$$\overline{X}(f) = \qquad \text{Eq. 106}$$

$$\overline{X}_{even}(f) + \overline{X}_{odd}(f) = \frac{1}{T_s} \sum_{k=-\infty}^{\infty} \frac{1 + e^{-j\pi k(1+\tau/T_s)}}{2} X\left(f - \frac{k}{2T_s}\right)$$

The term of k=1 in Eq. (106), which contributes as a spurious component, remains nonzero when τ is nonzero. The factor of (½){1−exp[−jπτ/Ts]} in the Eq. (106) gives the ratio of this spurious component to the signal X(f).

Principle of the phase error correction

Next, the principle of the phase error correction will be described in detail in what follows.

^X=X_even(f) +^X_odd(f) contains a spurious component due to the phase error τ. A target waveform, which is not affected by this phase error τ need be generated. Keeping in mind that the factor of (½) (1−exp[−jπτ/Ts]) is responsible for the degradation caused by the phase error, the following waveform is introduced by the Equation (107) below.

$$\overline{X}'(f) = \overline{X}_{even}(f) + e^{j\pi\tau/Ts}\overline{X}_{odd}(f) \qquad \text{Eq. 107}$$

In the above Eq. (107), the factor of exp[jπτ/Ts] is inserted in front of ^X_odd(f) to cancel out the spurious component. ^X' (f) has the following expression (Equation (108)) including the terms of k=0, 1, 2.

$$\overline{X}'(f) = \frac{1}{T_s}\left\{\left(\frac{1+e^{j\pi\frac{\tau}{T_s}}}{2}\right)X(f) + \left(\frac{1+e^{-j\pi\frac{\pi}{T_s}}}{2}\right)X\left(f-\frac{1}{T_s}\right)\right\} \quad \text{Eq. 108}$$

The term of k=1 is canceled out in the above Eq. (108). The second term on the right-hand side of the Eq. (108) contributes as an aliasing component. Next, whether or not ^X' (f) can be used as an alternative will be examined.

Compared to the Eq. (104), there is an extra factor of (½) {1+exp[jπτ/Ts]} on the first term in the Eq. (108). Thus, it turns out that the waveform of ^X' (f) is different from the target waveform. Now, the present embodiment is made to compensate this factor and that in the aliasing component. If the input waveform satisfies the sampling theorem (X(f)=0 for |f|>½Ts), the terms of X(f) and X(f-1/Ts) are separated from each other residing in the both sides of the Nyquist frequency ½Ts. Thus, it is possible to compensate the lower half (beneath the Nyquist frequency) and the upper half (beyond the Nyquist frequency) of ^X' (f) separately. The following wave form given by the Equation (109) serves to do that.

$$\overline{X}''(f) = \begin{cases} \left(\frac{1+e^{j\pi\tau/T_s}}{2}\right)^{-1}\overline{X}'(f) & (0 < f \leq 1/2T_s) \\ \left(\frac{1+e^{-j\pi\tau/T_s}}{2}\right)^{-1}\overline{X}'(f) & (1/2T_s < f \leq 1/T_s) \end{cases} \quad \text{Eq. 109}$$

If X(f)=0 for |f|>½Ts, substitution of ^X' (f) by the right-hand side of the Eq. (108) gives the following Equation (110).

$$\overline{X}''(f) = \frac{1}{T_s}\left(\overline{X}(f) + \overline{X}\left(f - \frac{1}{T_s}\right)\right) \quad \left(0 \leq f \leq \frac{1}{T_s}\right) \quad \text{Eq. 110}$$

Thus, the effect of τ is now corrected in the above Eqs. (109) and (110).

Method of correcting the phase error

Next, how to actually calculate in order to correct the phase error will be described in detail.

A method to be described here is a calculation of ^X" (f) from the actually measured data x(nTs), where n =0, 1, 2, ... N-1. For example, the frequency domain characteristics of the input data are calculated usually using Discrete Fourier Transformation (DFT). A DFT is carried out using the following Equation (111).

$$DFT(k) = \sum_{n=0}^{N-1} x(nT_s)e^{-j2\pi kn/N} \quad (k = 0, \ldots, N-1) \quad \text{Eq. 111}$$

First, the relationship between DFT(k) of Eq. (111) and X(f) will be described. The Fourier Transformation of Eq. (101) is given by the following Equation (112).

$$\overline{X}(f) = \sum_{n=0}^{N-1} x(nT_s)e^{-j2\pi fnT_s} \quad \text{Eq. 112}$$

Comparing the above Eq. (111) and Eq. (112), the following relation holds as expressed by the Equation (113).

$$DFT(k) = \overline{X}\left(\frac{k}{NT_s}\right) \quad \text{Eq. 113}$$

From the Eq. (113) it can be shown that the DFT calculates values not of X(f), but of ^X' (f) sampled at the frequency points of k/NTs. The same rationale will be applied to the data obtained using the time-interleaved ADC's 31, 32 illustrated in FIG. 2. Denoting the DFT for the data obtained by the first ADC 31 as DFT_even(k) and the DFT for the data obtained by the second ADC 32 as DFT_odd(k), they are given by the Equation (114).

$$DFT_{even}(k) = \sum_{m=0}^{N/2-1} x(2mT_s)e^{-j2\pi kn/N} \quad (k = 0, \ldots, N/2-1) \quad \text{Eq. 114}$$

$$DFT_{odd}(k) = \sum_{m=0}^{N/2-1} x((2m+1)T_s + \tau)e^{-j2\pi kn/N} \quad (k = 0, \ldots, N/2-1)$$

It is to be noted that in the Eq. (114) the number of data for each DFT is N/2 respectively. Comparing the Eq. (114) and the Fourier Transformation of Eq. (112), the following relation expressed by the Equation (115) is deduced.

$$DFT_{even}(k) = \overline{X}_{even}\left(\frac{k}{NT_s}\right) \quad (k = 0, \ldots, N/2-1) \quad \text{Eq. 115}$$

$$DFT_{odd}(k) = e^{j2\pi f(\tau+T_s)}\overline{X}_{odd}\left(\frac{k}{NT_s}\right) \quad (k = 0, \ldots, N/2-1)$$

Thus, ^X" (f) is calculated from DFT_even(k) and DFT_odd(k). Relating the Eqs. (108), (109) and (115), the following Equation (116) is obtained.

$$\overline{X}''\left(\frac{k}{NT_s}\right) = \begin{cases} \frac{2}{1+\alpha}\left[DFT_{even}(k) + \alpha \cdot \overline{W}_N^k DFT_{odd}(k)\right] & (k = 0, \ldots, N/2 - 1) \\ \frac{2\alpha}{1+\alpha}\left[DFT_{even}(k) + \alpha \cdot \overline{W}_N^k DFT_{odd}(k)\right] & (k = N/2, \ldots, N - 1) \end{cases} \quad \text{Eq. 116}$$

In the above Eq. 116, α is defined as exp[jπτ/Ts] and the twiddle factor or rotation factor ^W_N as exp[j2π(1+τ/Ts)/N]. Thus, a method of correcting the phase error is established by the Eq. 116. It is to be noted that the Eq. (116) is implemented and expressed as an extension to the Fast Fourier Transformation (FFT). If τ=0, the following Equation (117) is obtained from the Eq. (111) and Eq. (114).

$$DFT(k) = DFT_{even}(k) + W_N^k DFT_{odd}(k) \quad \text{Eq. 117}$$

where $W_N$=exp[j2π/N]. The FFT algorithm, that is a method by which to correct the phase error according to the present embodiment, is based on this calculation formula given by the Eq. (117), which calculates DFT of all data points from DFT of the even-numbered data points and DFT of the odd-numbered data points. This procedure is depicted as a signal flow diagram in FIG. 4 in the case of N=8, the number of data being 8. This operation procedure is called a butterfly operation. The FFT employs this butterfly operation recursively in order to execute the calculation of the Discrete Fourier Transformation (DFT).

Comparing the Eq. (116) with Eq. (117) above, it is understood that a few modification lead to the signal diagram realized by the Eq (116) as shown in FIG. 4. Modified factors are α, β, and β where a is a phase shifting factor such as exp[jπτ/Ts] and β and β' serves as another phase correcting factors related to α such as β being 1/(1+α), or not related to α; in the latter case, β and β' are preferably related to each other such that β+β'=1. The modified twiddle factor or rotation factor is such that ^W_N=(W_N)^(1+τ/Ts). Hence, the present embodiment does not necessitate a newly created hardware thus making the present embodiment very cost-effective, and a small modification to the already available hardware results. Moreover, the present embodiment results in the significant improvement of accuracy in the semiconductor device testing thus leading to improve the manufacturing yield.

The method and algorithm implemented according to the above-described present embodiments generate the phase-error corrected waveform in the frequency domain. The time domain waveform is determined from the frequency data domain using an inverse FFT (IFFT).

Measurement of the Phase Error τ

Next, measurement of the phase error τ will be described.

In the description so far, it was presupposed that the value of the phase error τ is already known and available when performing the phase error correction operation. Hereinbelow, it is depicted that how this value and some other values are measured which can be used for calibration of mismatches between a plurality of ADC's including a gain factor.

The measurement method is performed such that a sinusoidal waveform is applied as a test signal to the inputs of the plural time-interleaved ADC's. The outputs of the plural ADC's are then processed to generate Fourier transformations. The frequency of the test signal will be carefully selected so that the affect of quantization noise and the leakage due to windowing functions can be minimized.

Considering the timing offset and the gain factor, an output waveform of each ADC is expressed as follows.

$$A \cdot \sin(2\pi f_0 t + \phi)$$

where A is the gain factor and φ is a phase factor resulting from the sampling time offset. The $f_0$ is the frequency of the test signal which is chosen such that $f_s = nf_0$ where n is a prime number.

The values of A and φ are obtained from DFT data for each ADC, as shown in the Eq. (118-1) and Eq. (118-2).

$$A_i = |DFT(n)|(i=1, 2) \quad \text{Eq. 118-1}$$

$$\phi_i = \arg[DFT(n)](i=1, 2) \quad \text{Eq. 118-2}$$

where |z| denotes the modulus of a complex number z and arg[z] represents the argument of complex number z. Errors between the values for each ADC output exist due to the gain and timing mismatch. The value $A_1/A_2$ will be multiplied to the data from the second ADC (see FIG. 2) to offset the gain mismatch beforehand. The value of τ is obtained from the following Equation (119).

$$\tau/T_s = (\phi_1 - \phi_2)/2\pi f_0 T_s \quad \text{Eq. 119}$$

Modifications

The phase error correcting butterfly operation unit 220 according to the above present embodiments may be applied to a case where there are provided $2^n$ time-interleaved ADC's, n being an arbitrary integer greater than 1. Since the phase error correcting means is realized modifying the butterfly operation of the FFT processing, the last n stages of butterfly operations are carried out by implementing n-layered (n-step) phase correcting butterfly operation units as illustrated by FIG. 6B (n being 3 such that $2^3$=8) and FIG. 7B (n being 2 such that $2^2$=4).

Figure 6A:
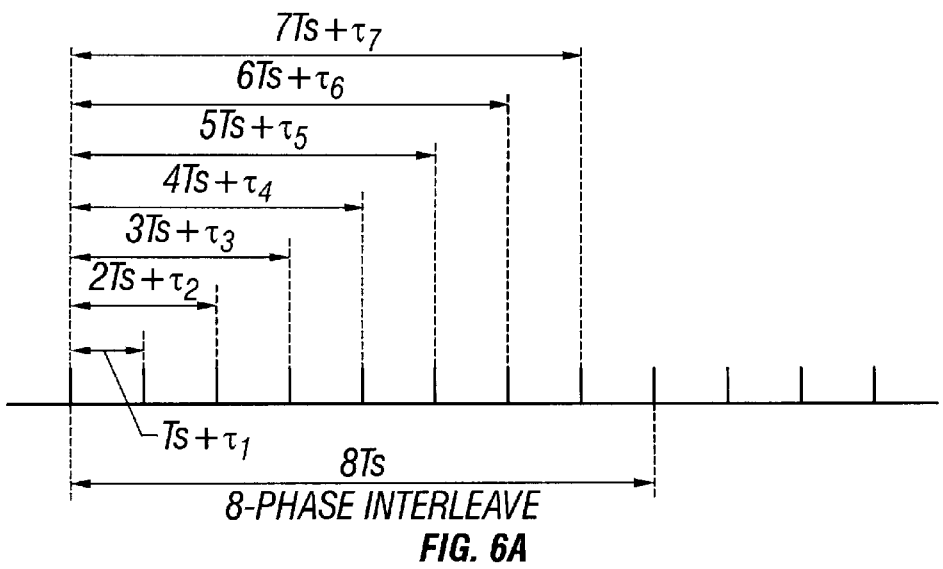
FIGS. 6A and 6B show an FFT processing scheme including $2^n$ time interleaving ADC's with n being 3, according to another embodiment of the present invention.

An embodiment according to the present invention underlying the above scheme will be described by referring to FIG. 6A and FIG. 6B. FIGS. 6A and 6B illustrate another embodiment according to the present invention employing 8-way time interleaving scheme. Suppose that when the first way waveform is regarded as a reference timing, phase shiftings of other 7-way waveforms include τ1, τ2, τ3, τ4, τ5, τ6 and τ7, respectively. Here, it is to be noted that how to measure the phase shifts in order to obtain respective phase shifts of τ1 to τ7 is followed in a similar manner to that related to the 2-way interleaving scheme described above.

Figure 6B:
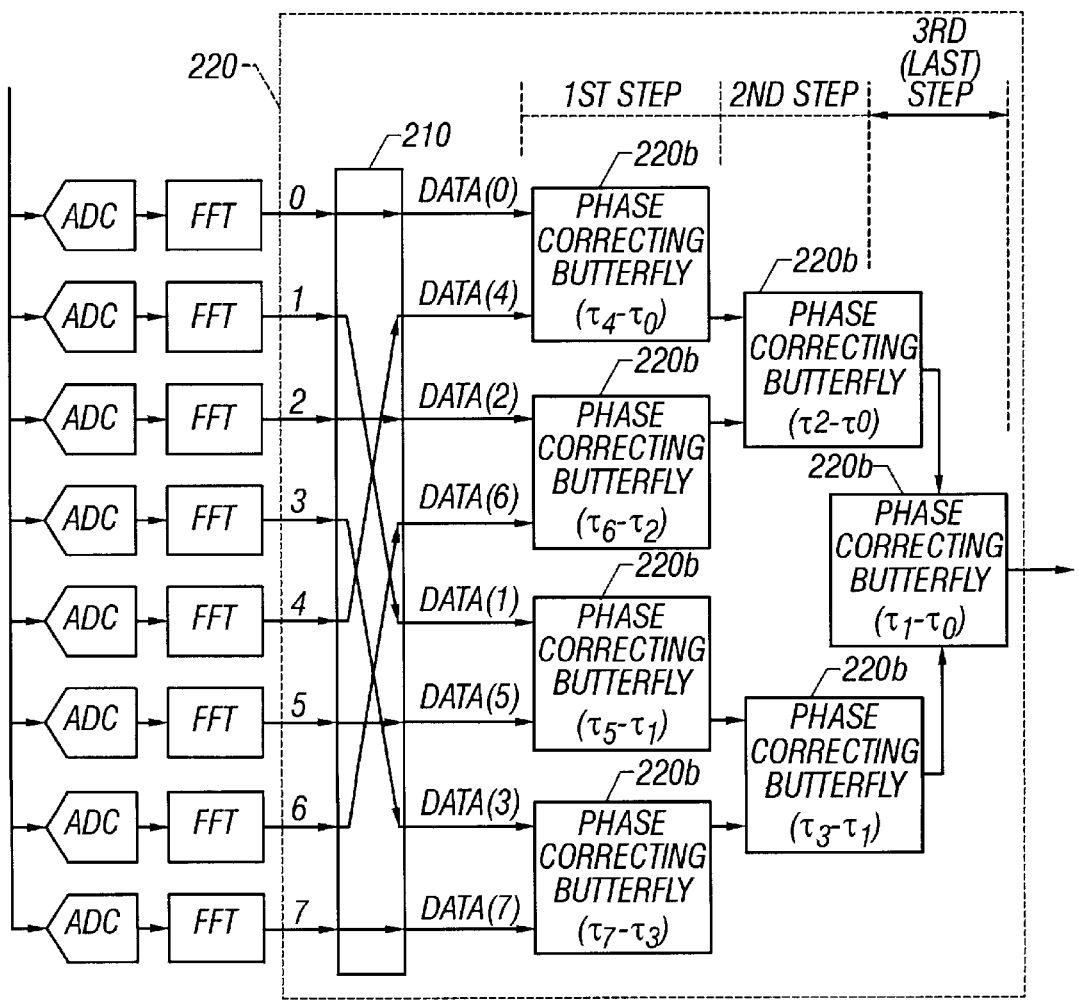

FIG. 6B shows the use of time-interleaved data from 8 ADC's where outputs from each ADC are DATA(0), DATA(1), . . . , DATA(7), with delay time represents as τ0, τ1, . . . , τ7. First, the data are processed using an FFT. Then, phase error correcting butterfly operation units 220b's perform calculation to offset the error. The inner structure of the phase error correcting butterfly operation unit 220 for the 8-way interleaving has 3 layered steps (since 8=$2^3$) and the total of the phase error correcting butterfly operation units 220b's provided is 6 units since in general the total number of the phase error correcting butterfly operation units required is expressed by $$2^{(n-1)}+2^{(n-2)}+\ldots 2^{(n-(n+1))}+2^{(n-n)} \text{ or}$$

$$2^{(n-1)}+2^{(n-2)}+\ldots 2^{1}+2^{0}(=1). \quad \text{Rule (*)}$$

In other words, if n=3 as in this embodiment, the total number of the phase error correcting butterfly operation units are $2^2+2^1+1=7$ which can be verified from FIG. 6B. The phase error correcting butterfly operation unit 220 further includes a bit reversing unit 210, so that the FFT (DFT) processed outputs have the order of the bit reversed as DATA(0), DATA(4), DATA(2), DATA(6), DATA(1), DATA(5), DATA(3) and DATA(7)in this order corresponding to the input data sequences of DATA(0), DATA(1), DATA(2), DATA(3), DATA(4), DATA(5), DATA(6) and DATA(7).

Upon receipt of each way output data DATA(0)–DATA(7) as a result of the FFT processing via 8-channel ADC, a butterfly operation is performed per two inputs. In other words, since there are 8 channels, there are provided four phase error correcting butterfly operation units in the first phase error correcting step in which respective phase error correcting butterfly operations are performed on ($\tau 4-\tau 0$), ($\tau 6-\tau 2$), ($\tau 5-\tau 1$) and ($\tau 7-\tau 3$). There are provided two phase error correcting butterfly operation units in the second phase error correcting step in which upon receipt of four butterfly operated data from the previous (first) phase error correcting step the respective phase error correcting butterfly operations are performed on ($\tau 2-\tau 0$) and ($\tau 3-\tau 1$). There is provided a phase error correcting butterfly operation unit in the third phase error correcting step in which upon receipt of two butterfly operated data from the previous (second) phase error correcting step the phase error correcting butterfly operation is performed on ($\tau 1-\tau 0$). The output from this third (last) step serves as the FFT processed data in which the phase errors in the respective interleaving ways are corrected. The bit reversing unit 210 operates to reverse the order of the input data as found in an ordinary butterfly operation. Though $\tau 0$ is written as such, $\tau 0$ equals to 0 since the first-way data serve as the reference.

The structure and operational method of the respective phase error correcting butterfly operation units 220b are same as the above described 2-way time interleaved butterfly operation unit 220 which performs the phase error correcting butterfly operation on the phase error $\tau$ to be corrected. However, in this embodiment shown in FIG. 6B, the phase correcting amount differs from that in the embodiment shown in FIG. 4. Namely, in the first phase error correcting step the phase error correcting operation is carried out using ($\tau 4-\tau 0$), ($\tau 6-\tau 2$), ($\tau 5-\tau 1$) and ($\tau 7-\tau 3$); and in the second phase error correcting step the phase error correcting operation is carried out using ($\tau 2-\tau 0$) and ($\tau 3-\tau 1$); and in the last (third) phase error correcting step the phase error correcting operation is carried out using ($\tau 1-\tau 0$). The output data obtained in the last step are the FFT processed output data in which the phase errors $\tau 1-\tau 7$ of the respective interleave ways are corrected.

Figure 7A:
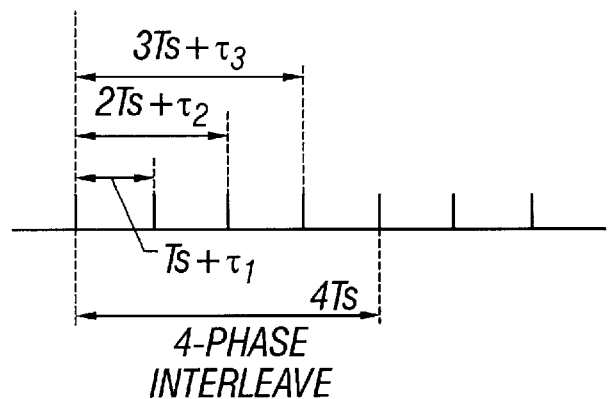
FIGS. 7A and 7B show an FFT processing scheme including $2^n$ time interleaved ADC's with n being 2, according to still another embodiment of the present invention.
Figure 7B:
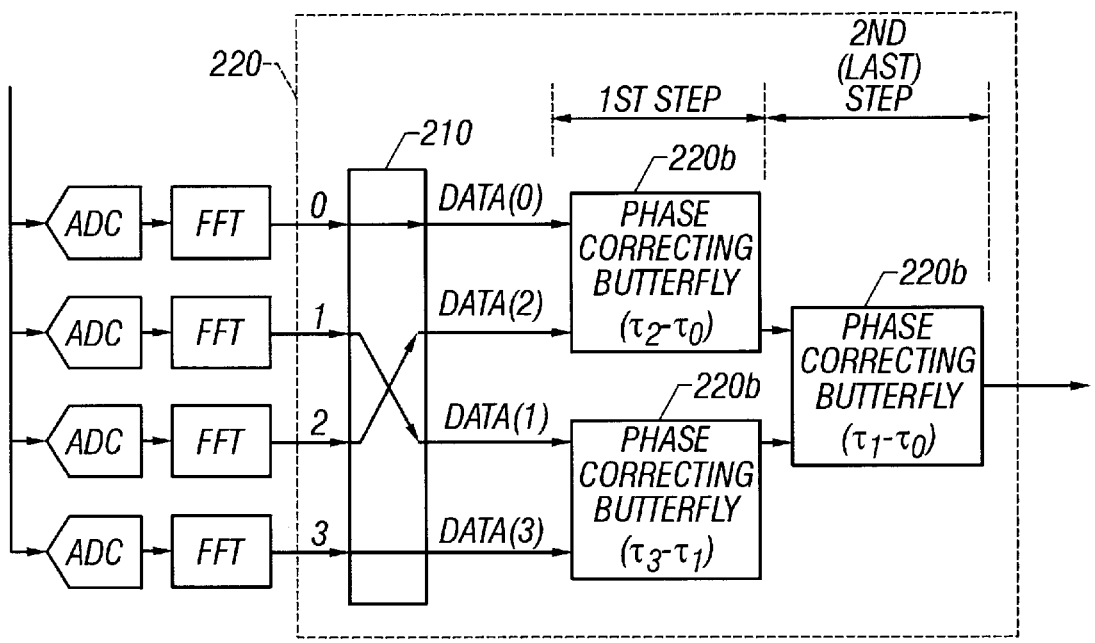

FIG. 7A and FIG. 7B show still another embodiment employing 4-way time interleaving scheme ($2^2=4$). Suppose that when the first way waveform is regarded as a reference timing, phase shiftings of other 3-way waveforms include $\tau 1$, $\tau 2$ and $\tau 3$.

The inner structure of the phase correcting butterfly operation unit 220 for the 4-way interleaving has 2 layered steps (since $4=2^2$) according to the above mentioned rule (*). The error correcting FFT processing unit 220 further includes a bit reversing unit 210, so that the FFT (DFT) processed outputs have the order of the bit reversed as DATA(0), DATA(2), DATA(1) and DATA(3) in this order corresponding to the input data sequences of DATA(0), DATA(1), DATA(2), DATA(3) and DATA(4).

Upon receipt of each way output data DATA(0)–DATA(3) as a result of the FFT processing via 4-channel ADC's, an butterfly operation is performed per two inputs. Thus, since there are 4 channels, there are provided two phase error correcting butterfly operation units in the first phase error correcting step in which respective phase error correcting butterfly operations are performed on ($\tau 2-\tau 0$) and ($\tau 3-\tau 1$). There is provided an error correcting butterfly operation unit in the second (last) phase error correcting step in which upon receipt of two butterfly operated data from the previous (first) phase error correcting step the phase error correcting butterfly operation is performed on ($\tau 1-\tau 0$). The output from this second (last) step serves as the FFT processed data in which the phase errors in the respective interleaving ways are corrected. The bit reversing unit 210 operates to reverse the order of the input data as found in an ordinary butterfly operation.

Though the above modifications according to the present invention are described in the case where there are $8(=2^3)$ and $4(=2^2)$ input data, the same principle is applied to the case with $2^n$, n being and arbitrary integers.

Furthermore, if the speed of calculation is not an issue and if the number of data is not of $2^n$, the present embodiments may also be applied to a digitizer employing a unit for performing an FFT process or Discrete Fourier Transformation (DFT) process.

Moreover, if the calculation time does not much matter, the FFT processing unit may be replaced simply with a Fourier Transformation (FT) unit for performing an FT on the time-interleaved input data or may be replaced with a Discrete Fourier Transformation (DFT) unit for performing a DFT on the input data.

By providing the phase error correcting butterfly operation unit, according to the present embodiments, having a first error correcting unit, second error correcting unit and third error correcting unit by which in the phase error correcting butterfly operation unit (s) of the FFT processing scheme there are inserted a first error correcting factor, second error correcting factor and third error correcting factor such as the $\alpha$, $\beta$ and $\beta'$ described above, there can be obtained FFT processed results with the phase errors of the sampling having been offset, thereby achieving significantly improved and accurate semiconductor testing.

Moreover, by implementing the present embodiments, the dynamic range of the time-interleaved ADC application is effectively improved by removing the spurious component due to the phase error.

Moreover, the error correcting unit and a method therefor in the present invention requires no additional hardware and only a little additional calculation power. Thus, in the light of fact that the conventional ADC method will suffer severely from the misalignment of sampling instances as LSI technology further advances and higher sampling rates will be demanded, the FFT processing unit including the butterfly operation unit and a method therefor achieved by the present embodiments will be far valuable to the semiconductor industry as a whole.

Although the present invention has been described by way of exemplary embodiments, it should be understood that many changes and substitutions may be made by those skilled in the art without departing from the spirit and the scope of the present invention which is defined only by the appended claims.

What is claimed is:

1. A digitizer for converting an analog signal output from a semiconductor device to a digital signal, the digitizer comprising:

N Analog-to-Digital converters, N being an integer greater than or equal to 2, which sequentially convert the analog signal output from the semiconductor device to the digital signal, a phase error term of sampling time displaced from an ideal timing being denoted $\tau$;

an N-way time interleaving unit which interleaves the digital signals output from said Analog-to-Digital converters in sequence and produces a data sequence; and a Fourier Transformation processing unit for performing Fourier Transformation processing on the data sequence output from said N-way time interleaving unit, the Fourier Transformation processing unit including a butterfly operation unit which inserts a phase error correcting factor to a butterfly operation performed by said butterfly operation unit, so as to correct $\tau$ for the data sequence on which the Fourier Transformation processing is performed.

2. A digitizer of claim 1, wherein said FT processing unit performs a Fast Fourier Transformation (FFT) processing on the data sequence.

3. A digitizer of claim 1, wherein said FT processing unit performs a Discrete Fourier Transformation (DFT) processing on the data sequence.

4. A digitizer of claim 2, wherein said FT processing unit includes a first FFT processing unit for performing an FFT processing on an even-numbered data sequence and a second FFT processing unit for performing an FFT processing on an odd-numbered data sequence, and wherein said butterfly operation unit multipliers a firt phase correcting factor of the phase correcting factor to the data sequence which is FFT-processed by said second FFT processing unit.

5. A digitizer of claim 4, wherein said butterfly operation unit further multiplies second and third phase error correcting factors to the data sequence which are FFT-processed by said first and second FFT processing units.

6. A digitizer of claim 5, wherein the first phase error correcting factor being denoted $\alpha$ is represented by $$\alpha = \exp[j\pi\tau/Ts]$$

where Ts is a sampling period of the analog signal and j is a imaginary number unit such that $j^2 = -1$.

7. A digitizer of claim 5, wherein the second and third phase error correcting factors being denoted $\beta$ and $\beta'$, respectively, are such that $\beta + \beta' = 1$.

8. A digitizer of claim 5, wherein said butterfly operation unit multiplies the first phase error correcting factor being denoted $\alpha$ to the FFT-processed data sequence output from said second FFT processing unit, and multiplies the second and third phase error correcting factors being denoted $\beta$ and $\beta'$, respectively to the FFT-processed data sequences output from said first FFT processing unit together with the thus $\alpha$-multiplied FFT-processed data sequence, $\alpha$ being defined such that $$\alpha = \exp[j\pi\tau/Ts]$$

where Ts is a sampling period of the analog signal, j is a complex number unit such that $j^2 = -1$, and $\beta$ and $\beta'$ being such that $\beta + \beta' = 1$.

9. A digitizer of claim 7, wherein the second phase correcting factor $\beta$ is expressed by $1/(1+\alpha)$ and the third phase correcting factor $\beta'$ is expressed by $\alpha/(1+\alpha)$, where $\alpha$ is the first phase error correcting factor.

10. A digitizer of claim 9, wherein the phase error correcting factor $\alpha$ is given by $\exp[j\pi\tau/Ts]$, where Ts is a sampling period, $\tau$ is the phase error and j is a complex number unit such that $j^2 = -1$.

11. A digitizer of claim 1 having two ADC's and $m = 2^n$ input data, n being greater than 1, wherein the butterfly operation unit corrects the phase error $\tau$ based on:

$$X(k) = \beta\{X_{even}(k) + \alpha \cdot \overline{W}_m^k X_{odd}(k)\}$$

$$X(p) = \beta\{X_{even}(k) + \alpha \cdot \overline{W}_{mp} X_{odd}(k)\}$$

where k runs through 0 and $2^{n-1}-1$, and p runs through $2^{n-1}$ and $2^n-1$, $$\beta = 1/(1+\alpha),$$

$$\beta' = \alpha/(1+\alpha),$$

$$\overline{W}_m = W^{(1+\tau/Ts)}{}_m$$

$X_{even}(k)$ is an FFT value of an even-numbered data sequence output from said time interleaving unit, $X_{odd}(p)$ is an FFT value of an odd-numbered data sequence output from said time interleaving unit, and $X(k)$ and $X(p)$ are final values output from the butterfly operation unit.

12. A digitizer of claim 11 having $8 = 2^3$ input data, wherein the butterfly operation unit corrects the phase error $\tau$ based on:

$$X(0) = \beta\{X_{even}(0) + \alpha \cdot \overline{W}_8^0 X_{odd}(0)\}$$

$$X(1) = \beta\{X_{even}(1) + \alpha \cdot \overline{W}_8^1 X_{odd}(1)\}$$

$$X(2) = \beta\{X_{even}(2) + \alpha \cdot \overline{W}_8^2 X_{odd}(2)\}$$

$$X(3) = \beta\{X_{even}(3) + \alpha \cdot \overline{W}_8^3 X_{odd}(3)\}$$

$$X(4) = \beta'\{X_{even}(0) + \alpha \cdot \overline{W}_8^4 X_{odd}(0)\}$$

$$X(5) = \beta'\{X_{even}(1) + \alpha \cdot \overline{W}_8^5 X_{odd}(1)\}$$

$$X(6) = \beta'\{X_{even}(2) + \alpha \cdot \overline{W}_8^6 X_{odd}(2)\}$$

$$X(7) = \beta'\{X_{even}(3) + \alpha \cdot \overline{W}_8^7 X_{odd}(3)\}$$

13. A digitizer for converting analog signal output from a semiconductor device to digital signal, the digitizer comprising:

a plurality ($2^m$) of Analog-to-Digital Converters (ADC's) which sequentially convert the analog signal output from the semiconductor device to the digital signal, a phase error term of sampling time displaced from an ideal timing being denoted $\tau$, a plurality ($2^m$) of Fourier Transformation (FT) processing units which perform FFT on the $2^m$ digital signals, respectively; and m-layered phase error correcting butterfly operation units, the total number of the phase correcting butterfly operation units being $2^{\wedge}(m-1) + 2^{\wedge}(m-2) + \ldots 2^{\wedge}1 + 2^{\wedge}0$ (=1), wherein the first layered phase error correcting butterfly operation unit receives two separate digital signals output from said FT processing units and each of the second through last layered phase error correcting butterfly operation units receives two separate digital signals from the phase error correcting butterfly operation units of the previous layer and each of phase error correcting butterfly operation units corrects a plurality of phase errors τ based on:

$$X(k)=\beta\{X_{even}(k)+\alpha \cdot \overline{W}_{2^m}{}^k X_{odd}(k)\}$$

$$X(p)=\beta'\{X_{even}(k)+\alpha \cdot \overline{W}_{2^m}{}^k X_{odd}(k)\}$$

where X(k) and X(p) are FFT processed results for alternate data obtained from the previous step, α=exp[jπτ/Ts] with τ being a phase error and Ts being a sampling period of the analog signal, $$\beta+\beta'=1$$

$$\overline{W}_{2m}=W^{(1+\tau/Ts)}{}_{2m}$$

$X_{even}(k)$ is an FT value of an even-numbered data sequence output from said ADC, $X_{odd}(k)$ is an FT value of an odd-numbered data sequence output from said ADC, and X(k) and X(p) are value obtained in each of said m layered phase error correcting butterfly operation units.

14. A digitizer of claim 13, wherein said FT processing unit performs a Fast Fourier Transformation (FFT) processing on the digital signals.

15. A digitizer of claim 13, wherein said FT processing unit performs a Discrete Fourier Transformation (DFT) processing on the digital signals.

16. A digitizer of claim 13, wherein $$\beta=1/(1+\alpha)$$

and $$\beta'=\alpha/(1+\alpha).$$

17. A digitizer of claim 14, having $2^3$ (=8) input data and three layered (step) butterfly operation units which correct the phase errors, wherein, upon receipt of 8 input data, one (τ0) of the total of 8 phase errors (τ0, τ1, τ2, τ3, τ4, τ5, τ6, τ7) is made as a reference timing and the phase error correcting butterfly operation units correct the phase errors τ's in a manner that: in the four first-step error correcting butterfly operation units the phase error correcting butterfly operations are performed on (τ4−τ0), (τ6−τ2), (τ5−τ1) and (τ7−τ3), in the two second-step phase error correcting butterfly operation units the phase error correcting butterfly operations are performed on (τ2−τ0) and (τ3−τ1) and in the one third(last)-step phase error correcting butterfly operation units the phase error correcting butterfly operation is performed on (τ1−τ0).

18. A digitizer of claim 14, having $2^2$ (=4) input data and two layered (step) butterfly operation units which correct the phase errors, wherein, upon receipt of 4 input data, one (τ0) of the total of 4 phase errors (τ0, τ1, τ2, τ3) is made as a reference timing and the phase error correcting butterfly operation units corrects the phase errors τ's in a manner that: in the two first-step error correcting butterfly operation units the phase error correcting butterfly operations are performed on (τ2−τ0) and(τ3−τ1) and in a single second(last)-step error correcting butterfly operation unit the phase error correcting butterfly operation is performed on (τ1−τ0).

19. A semiconductor testing apparatus for testing a semiconductor device, comprising:

a pattern generator which generates a pattern signal and expectation signal;

a waveform shaper which shapes a waveform of the pattern signal output from said pattern generator;

a semiconductor contact portion which places the device thereon, supplies the pattern signal shaped by said waveform shaper to said semiconductor device and receives an analog signal output from the semiconductor device;

a waveform digitizer for converting the analog signal output from the semiconductor device to a digital signal, the digitizer comprising:

N Analog-to-Digital converters, N being an integer greater than or equal to 2, which sequentially convert the analog signal output from the semiconductor device to the digital signal, a phase error term of sampling time displaced from an ideal timing being denoted τ;

an N-way time interleaving unit which interleaves the digital signals from said ADC's in sequence and produces a data sequence; and a Fourier Transformation processing unit for performing Fourier Transformation processing on the data sequence output from said N-way time interleaving unit, the Fourier Transformation processing unit including a butterfly operation unit which inserts a phase error correcting factor to a butterfly operation performed by said butterfly operation unit, so as to correct τ for the data sequence on which the Fourier Transformation processing is performed; and a comparator which compares the pattern signal output from said pattern generator and a phase error collected data sequence output from the butterfly operation unit of said Fourier Transformation processing unit.

20. A digitizer of claim 19, wherein said FT processing unit performs a Fast Fourier Transformation (FFT) processing on the data sequence.

21. A digitizer of claim 19, wherein said FT processing unit performs a Discrete Fourier Transformation (DFT) processing on the data sequence.

22. A digitizer of claim 20 having $2^m$ input digital data, wherein the phase error correcting butterfly operation unit includes m layered phase error correcting units each of first layered phase error correcting units of which receives a set of two FFT processed data output from said FT processing units and each of the rest of which receives a set of two phase error corrected data from pervious phase error correcting butterfly operation units.

23. A method of correcting a phase error of a sampling period of an analog signal output from a semiconductor device, the phase error being denoted r and the sampling rate being denotes Ts, the method comprising:

sequentially converting the analog signal output from the semiconductor device to the digital signal, the phase error term τ of sampling time being displaced from an ideal timing;

time-interleaving the digital signals obtained from said converting the analog signal to the digital signal, so as to produce a data sequence; and performing Fourier Transformation processing on the data sequence obtained from said time-interleaving, said Fourier Transformation processing including:

inserting a phase error correcting factor to a butterfly operation, so as to correct τ for the data sequence on which the Fourier Transformation processing is performed.

24. A method of claim 23, wherein said FT processing performs a Fast Fourier Transformation (FFT) processing on the data sequence.

25. A method of claim 23, wherein said FT processing performs a Discrete Fourier Transformation (DFT) processing on the data sequence.

26. A method of claim 24, wherein said inserting the phase error correcting factor performs a butterfly operation by m-layered phase error corrections for $2^m$ input data and wherein said inserting the phase correcting factor is such that each of first layered phase error correctings receives a set of two FFT processed data and each of other phase error correctings receives a set of two phase error corrected data from pervious phase error correctings.

* * * * *

UNITED STATES PATENT AND TRADEMARK OFFICE
CERTIFICATE OF CORRECTION

PATENT NO.    : 6,384,756 B1
DATED         : May 7, 2002
INVENTOR(S)   : Shinsuke Tajiri et al.

It is certified that error appears in the above-identified patent and that said Letters Patent is hereby corrected as shown below:

<u>Title page,</u>
Item [56], References Cited, under the reference for Yamaguchi et al., please correct the spelling of the word "Conferenec" to -- Conference --.
Under the reference for Jenq, please correct the spelling of the word "Digtal" to -- Digital --.

Signed and Sealed this

Thirtieth Day of July, 2002

*Attest:*

*Attesting Officer*

JAMES E. ROGAN
*Director of the United States Patent and Trademark Office*